(12) United States Patent
Chung et al.

(10) Patent No.: US 6,605,534 B1
(45) Date of Patent: Aug. 12, 2003

(54) SELECTIVE DEPOSITION OF A CONDUCTIVE MATERIAL

(75) Inventors: Dean S. Chung, Essex Junction, VT (US); David V. Horak, Essex Junction, VT (US); Erick G. Walton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/605,322

(22) Filed: Jun. 28, 2000

(51) Int. Cl.[7] .................. H01L 21/4763; H01L 21/44
(52) U.S. Cl. ................ 438/674; 438/638; 438/677; 438/678; 438/687; 438/799
(58) Field of Search .................. 438/687, 795, 438/798, 799, 674–678, 637–641; 205/118, 123

(56) References Cited

U.S. PATENT DOCUMENTS

| | | | |
|---|---|---|---|
| 3,791,848 A | 2/1974 | DeAngelo | 427/307 |
| 4,295,924 A | 10/1981 | Garnache et al. | 438/589 |
| 5,256,274 A | 10/1993 | Poris | 205/123 |
| 5,316,974 A | 5/1994 | Crank | 438/643 |
| 5,629,564 A | 5/1997 | Nye, III et al. | 257/762 |
| 6,140,234 A | * 10/2000 | Uzoh et al. | |
| 6,168,704 B1 | * 1/2001 | Brown et al. | |
| 6,184,138 B1 | * 2/2001 | Ho et al. | |
| 6,379,871 B1 | * 4/2002 | Suzuki | |

OTHER PUBLICATIONS

P.C. Andricacos et al., Damascene Copper Electroplating for Chip Interconnections, vol. 42, No. 5, Sep. 1998, pp. 567–574.

* cited by examiner

Primary Examiner—Ha Tran Nguyen
(74) Attorney, Agent, or Firm—Schmeiser, Olsen & Watts; William D. Sabo

(57) ABSTRACT

The present invention provides a method of selectively inhibiting the deposition of a conductive material within desired regions of a semiconductor device. A seed layer is rendered ineffective to the electroplating in select regions of the substrate, by either the removal or the poisoning of the seed layer in select regions.

12 Claims, 5 Drawing Sheets

SELECTIVE DEPOSITION OF A CONDUCTIVE MATERIAL

BACKGROUND OF THE INVENTION

1. Technical Field

The present invention relates generally to semiconductor manufacture, and more particularly, to the deposition of a conductive material in select regions of a semiconductor substrate.

2. Related Art

Current semiconductor manufacturing processes typically utilize an aggressive chemical mechanical polishing (CMP) step to remove excess unwanted conductive material deposited on the surface of a semiconductor substrate, leaving only the conductive material within the circuit features. Otherwise, the excess conductive material remaining on the top surface of the substrate may cause shorts within the semiconductor device.

One problem that arises as a result of the CMP step is a phenomenon known as "dishing." Dishing often occurs during the polishing of large circuit features, wherein the soft deformable CMP polishing pad sinks into the circuit feature, forming a concave or "dish"-shaped indentation in the surface of the circuit feature. Unfortunately, such deformities typically replicate throughout the subsequent layers of the device.

Attempts have been made in the industry to solve the problems associated with the CMP step. For example, excess filler material, or "dummy" features, have been placed within the circuit features to prevent the CMP pad from contacting the surface of the feature. Similarly, techniques utilizing selective oxide polishing having a polish stop layer have been used. However, these attempted solutions have increased the time and cost of production by adding manufacturing steps and additional materials. Furthermore, these techniques have restricted the variety of features that could be formed within the semiconductor substrate.

Therefore, there exists a need in the industry for a method of forming a semiconductor device which solves the above problems.

SUMMARY OF THE INVENTION

The present invention provides a method of selectively depositing a conductive material within desired regions of a semiconductor substrate.

The first general aspect of the present invention provides a method of forming a semiconductor device, comprising the steps of: providing a substrate having at least one feature therein; depositing a seed layer over the substrate; rendering select regions of the seed layer ineffective to plating; and plating a conductive material on the substrate.

The second general aspect of the present invention provides a semiconductor device, comprising: a substrate, having at least one circuit feature therein; a seed layer covering the substrate, wherein the seed layer is ineffective to electroplating in select regions of the substrate.

The third general aspect of the present invention provides a method of forming circuit features, comprising: providing a substrate having at least one cavity therein; depositing a liner over a surface of the substrate; depositing a seed layer over the liner; rendering the seed layer ineffective to electroplating in select regions of the substrate; and electroplating a conductive material within the at least one cavity.

The foregoing and other features and advantages of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the embodiment. Although the drawings are intended to illustrate the present invention, the drawings are not necessarily drawn to scale.

Figure 1:
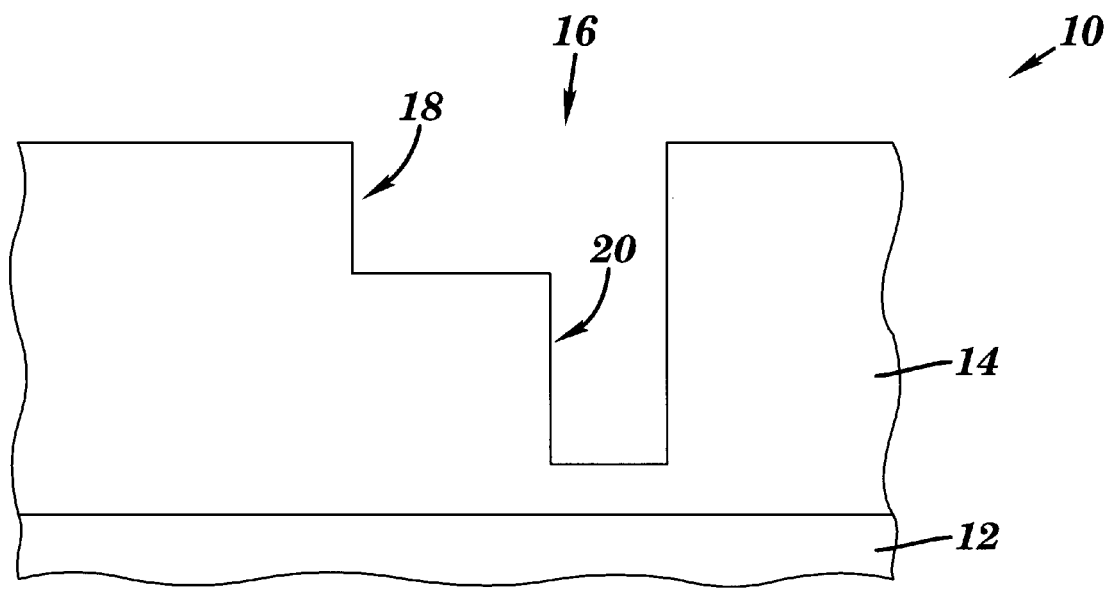
FIG. 1 depicts a structure having a circuit feature therein.

Referring to the drawings, FIG. 1 shows a substrate or semiconductor structure 10. In this example, the structure 10 is a dual damascene structure comprising a semiconductor wafer 12, such as a silicon wafer, having an insulative or dielectric layer 14 thereover. The dielectric layer 14 is deposited using a plasma chemical-vapor deposition (CVD) system, or in the alternative, using sputter deposition techniques, spin-on dielectric techniques, etc. A circuit feature 16, in this example a dual damascene feature comprising a trench 18 and a via 20, is formed within the dielectric layer 14 of the structure 10 using conventional back-end-of-the-line (BEOL) techniques. In the alternative, the structure 10 may also be comprised of a single damascene structure, having a single damascene circuit feature formed therein.

Figure 2:
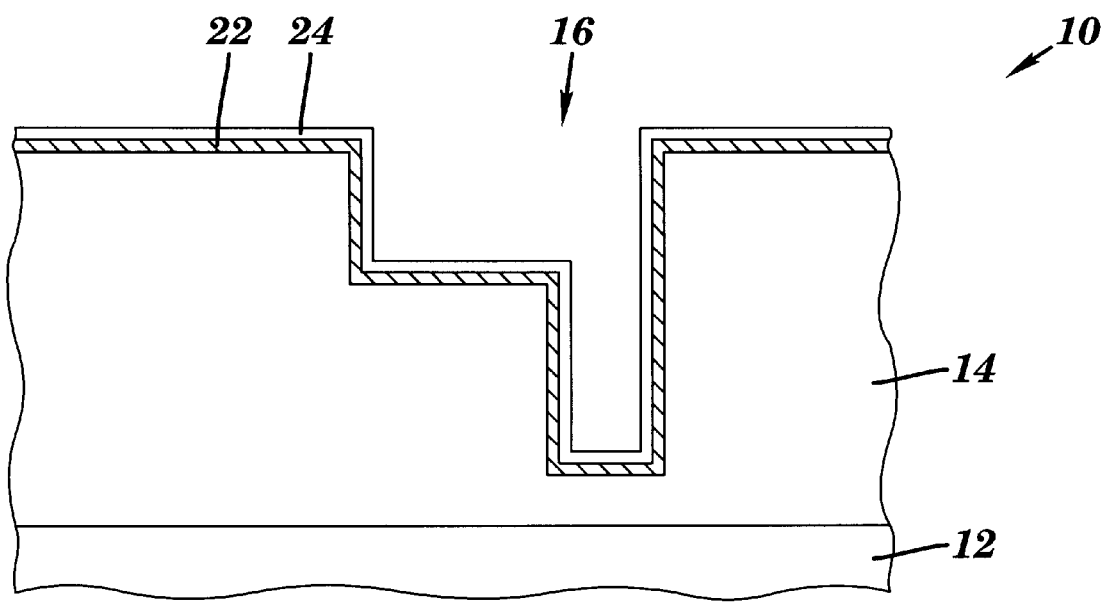
FIG. 2 depicts the structure of FIG. 1 having a liner and a seed layer thereover.

As shown in FIG. 2, a liner 22 is deposited over the surface of the structure 10, and within the circuit feature 16. The liner 22, having a thickness in the range of approximately 50–500 Å, may be comprised of tantalum, tantalum nitride, tungsten, titanium, titanium nitride, etc. The liner 22 may be deposited using a sputter deposition technique, or other similar deposition techniques. The liner 22 is used to prevent the conductive material deposited in the circuit feature 16 (described infra), from migrating into the surrounding regions of the structure 10.

A plating base or seed layer 24 is then deposited over the surface of the structure 10, using sputter deposition techniques, or other similar techniques, such as chemical vapor deposition (CVD) techniques, ionized plasma vapor deposition (IPVD), PVD, etc. In this example, the seed layer 24 is copper, however, other materials may also be used, such as tungsten, titanium, tantalum, etc., depending upon the form of plating technique used, as well as the conductive material to be deposited within the circuit features 16. The copper seed layer 24 has a thickness in the range of about 200–3000 Å. Copper is used in this example because the conductive layer to be deposited is also copper, and a copper seed layer 24 is generally used when electroplating a copper conductive material. The copper seed layer 24 is used because it permits the lowest activation energy, or the minimum over potential, for the deposition of copper.

Figure 3:
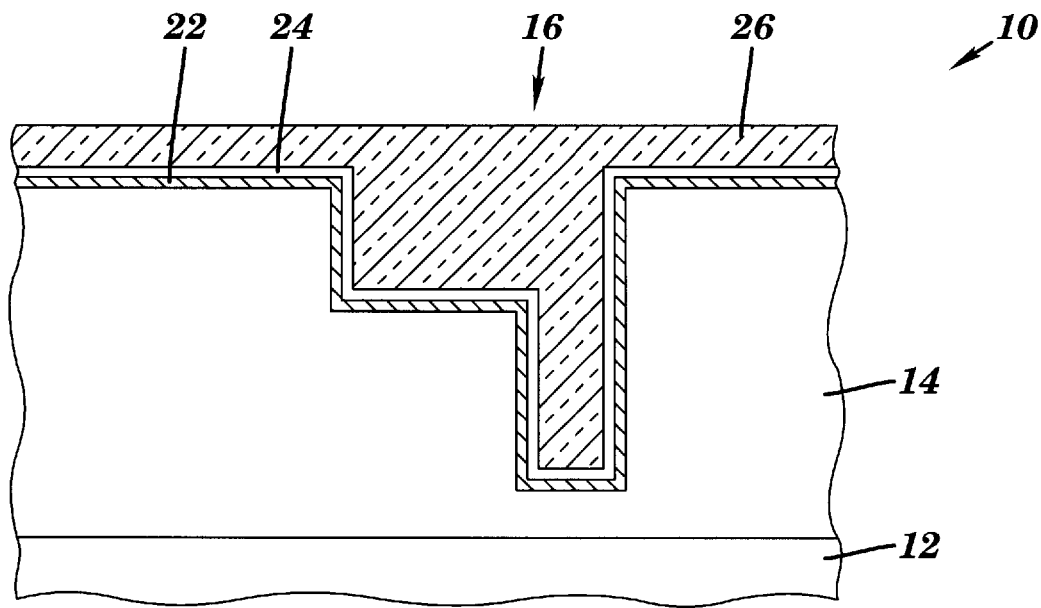
FIG. 3 depicts the structure of FIG. 2 having a sacrificial layer thereover.

The location of the seed layer 24 determines the regions of the structure 10 to which the conductive material will electroplate. Therefore, in a first embodiment, a sacrificial material 26 is used to selectively determine which regions of the structure 10 the conductive material will electroplate to. In particular, the sacrificial material 26 is deposited over the surface of the structure 10, as shown in FIG. 3. In this example, the sacrificial material 26 comprises a resist, such as photosensitive resist, photosensitive polyimide, etc. Resist is used because it is easy to remove during a subsequent step without damaging the surrounding structure 10.

Figure 4:
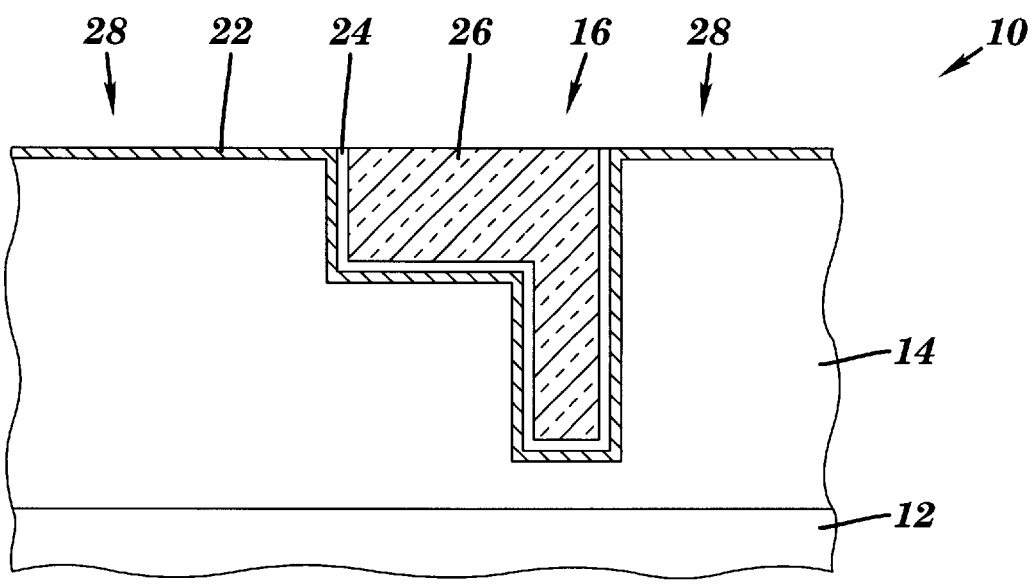
FIG. 4 depicts the structure of FIG. 3 having a planarized top surface.

The surface of the structure 10 is then planarized or polished down to the liner 22 using CMP. In the alternative, the surface of the structure 10 could be planarized using a blanket reactive ion etch (RIE) process followed by a CMP process. This planarization step removes the resist 26 and the seed layer 24 from the top surface 28 of the structure 10, while leaving the resist 26 within the circuit feature 16, as shown in FIG. 4. Removing the seed layer 24 from the top surface 28 of the structure 10 prevents the conductive material from electroplating to the top surface 28 during the deposition step (described infra), thereby eliminating the need for a subsequent CMP step. The resist 26 within the circuit feature 16 prevents the removal of the seed layer 24 within the circuit feature 16 where the conductive material is to be electroplated.

Figure 5:
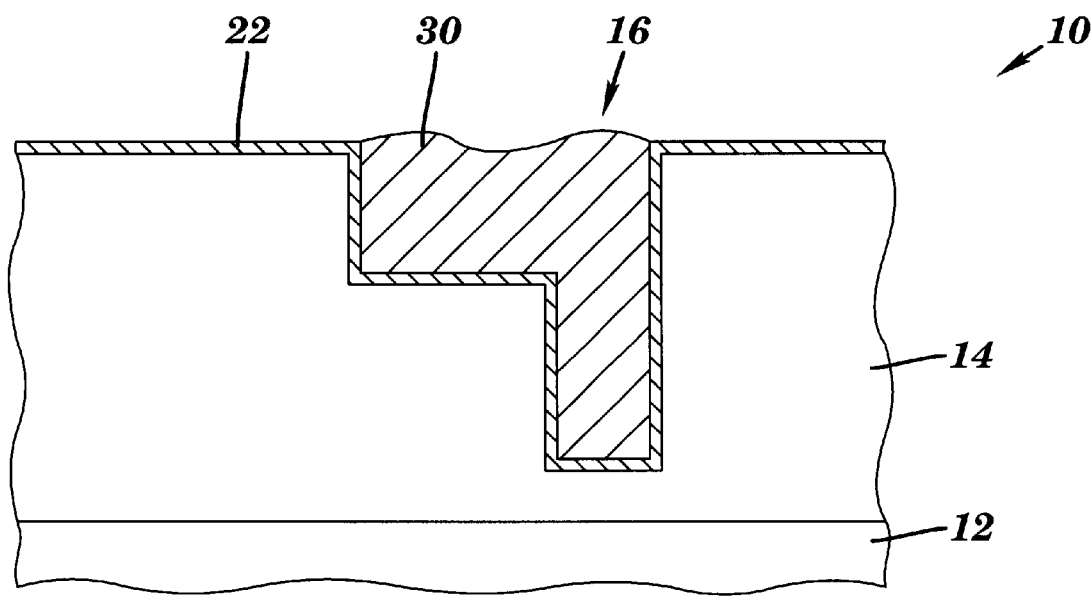
FIG. 5 depicts the structure of FIG. 4 having a conductive material within the circuit feature.

The resist 26 within the circuit feature 16 is then removed leaving the seed layer 24 within the circuit feature 16. The resist 26 within the circuit feature 16 is removed using conventional techniques, such as, washing the substrate 10 in an organic solvent, exposing the resist 26, performing a dry plasma etch, etc. As shown in FIG. 5, a conductive material 30, in this example, copper, is then deposited within the circuit feature 16 using an electrolytic plating technique. In particular, the structure 10 is placed in a container of electroplate solution, an external current is applied, and the conductive material 30 grows onto the seed layer 24. Since the seed layer 24 and the conductive material 30 are both copper in this example, as the conductive material 30 grows on to the seed layer 24 the division between the seed layer 24 and the conductive material 30 is eliminated. In the alternative, the seed layer 24 may be deposited using an electroless plating technique, which does not require the application of an externally applied current, in which case the conductive material 30 may be nickel, chromium, cobalt, etc.

Figure 6:
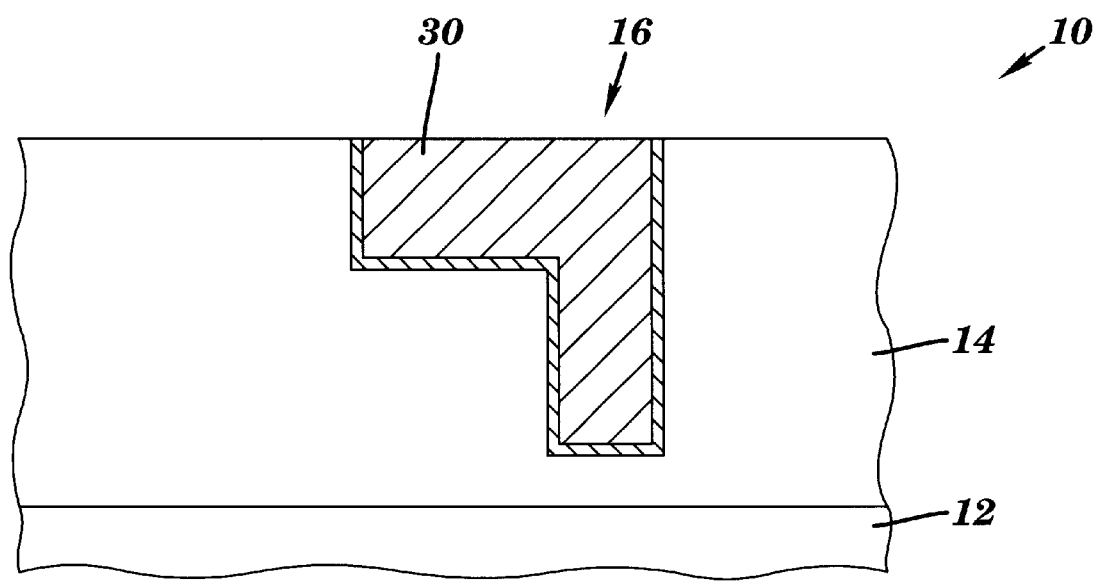
FIG. 6 depicts the structure of FIG. 5 having a planarized top surface.

Following the deposition of the conductive material 30 within the circuit feature 16, the top surface 28 of the structure 10 is planarized using a polishing techniques, or other similar technique. The planarization step removes the excess conductive material 30 that extends beyond the top surface 28 of the structure 10. The planarization step also removes the liner 22 on the top surface 28 of the structure 10, as illustrated in FIG. 6.

Figure 7:
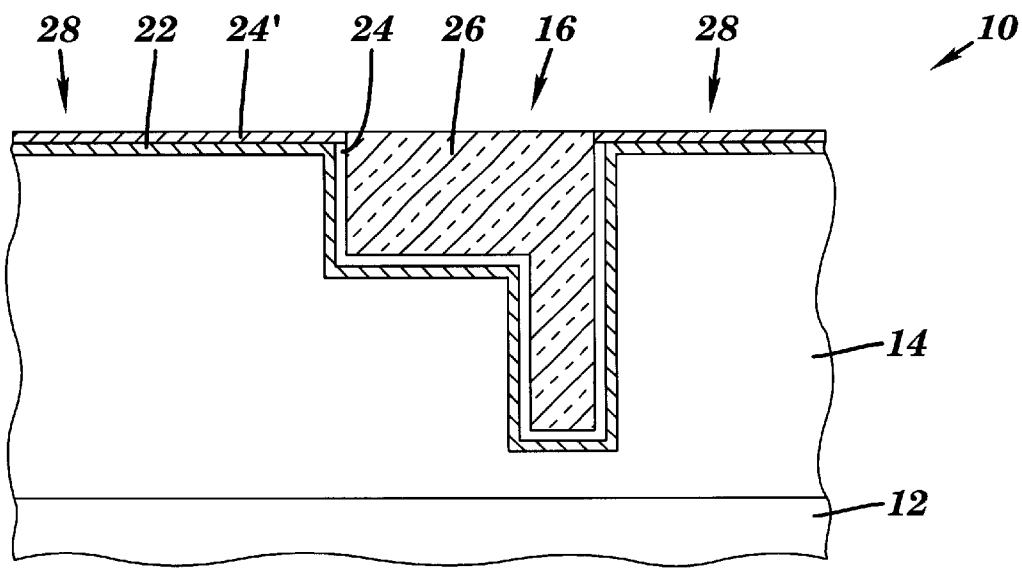
FIG. 7 depicts the structure having a poisoned top seed layer.

In accordance with a second embodiment, following the deposition of the sacrificial material 26 illustrated in FIG. 3, the structure 10 is planarized or polished. As shown in FIG. 7, the structure 10 is planarized to remove the resist 26 covering the top surface 28 of the structure 10, thereby exposing the seed layer 24 on the top surface 28. The resist 26 within the circuit feature 16 remains to protect the seed layer 24 therein from damage during the subsequent steps.

The exposed seed layer 24 on the top surface 28 of the structure 10 is then contaminated or "poisoned" to retard or prevent the electroplating of the conductive material 30 on the top surface 28. "Poisoning" of the seed layer 24 may be accomplished in several ways. For example, a copper seed layer 24 may be poisoned by depositing onto the seed layer 24 alkane thiols, polyethylene glycols, photoresist or spin-on-glass, electrodeposition of plating inhibitors, such as electrodeposited "prussian blue", etc., using spin-on deposition, or other similar deposition techniques. Accordingly, a poisoned seed layer 24' is formed as shown in FIG. 7.

Alternatively, the seed layer 24 may be poisoned by exposing the layer 24 to a chemical bath which reacts to form a copper compound on the surface of the layer 24. Only a fraction of the bulk copper seed layer 24 is required to react to form a suitable layer. In fact, only a few monolayers of the compound are necessary to inhibit electroplating of copper on the seed layer 24, and it may be necessary to convert only about 5–30% of the seed layer 24 to the required compound so as to function suitably. At least one example of such a compound is cupric iodide ($CuI_2$), which may be formed through exposure of the structure 10 (FIG. 4) to an aqueous solution of iodine ($I_2$), which is more properly depicted as a triiodide species ($I_3$) in an aqueous solution. Such a surface compound could also be formed by exposing copper to iodine in a mixture of water and a suitable alcohol (e.g., methanol, ethanol, propanol, butanol, or isopropanol) and iodine ($I_2$). In addition, an aqueous or aqueous acidic mixture of potassium iodate ($KIO_3$), or ammonium iodate ($NH_4IO_3$), may be used to convert a portion of the exposed seed layer 24 to cupric iodide. The compound formed on the surface of the seed layer 24 is a passive layer which does not permit plating through defects or pinholes in the surface of the layer 24, and is insoluble in the electroplating solution on the timescale of typical plating processes (e.g., up to several minutes).

Figure 8:
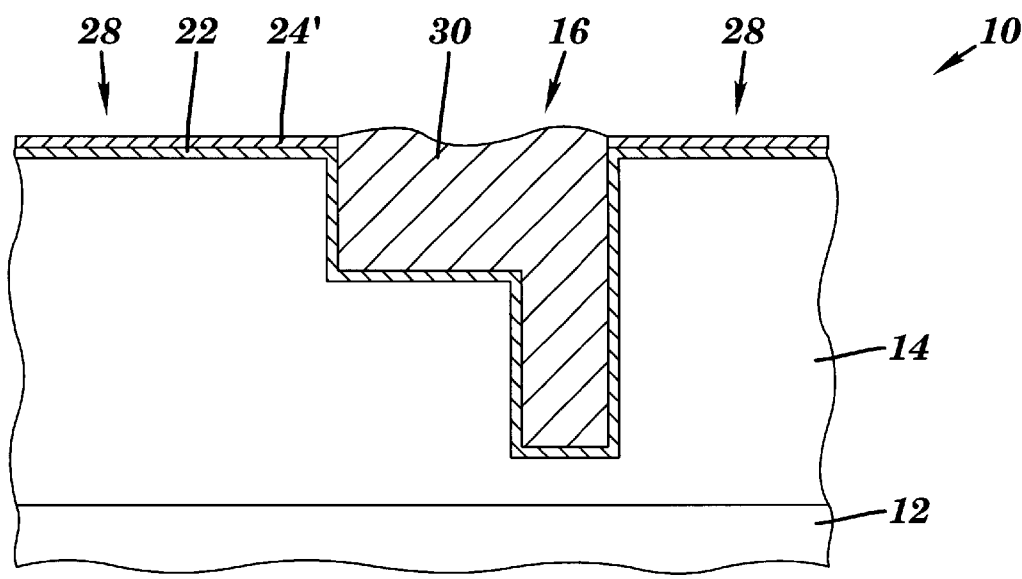
FIG. 8 depicts the structure of FIG. 7 having a conductive material therein.
Figure 9:
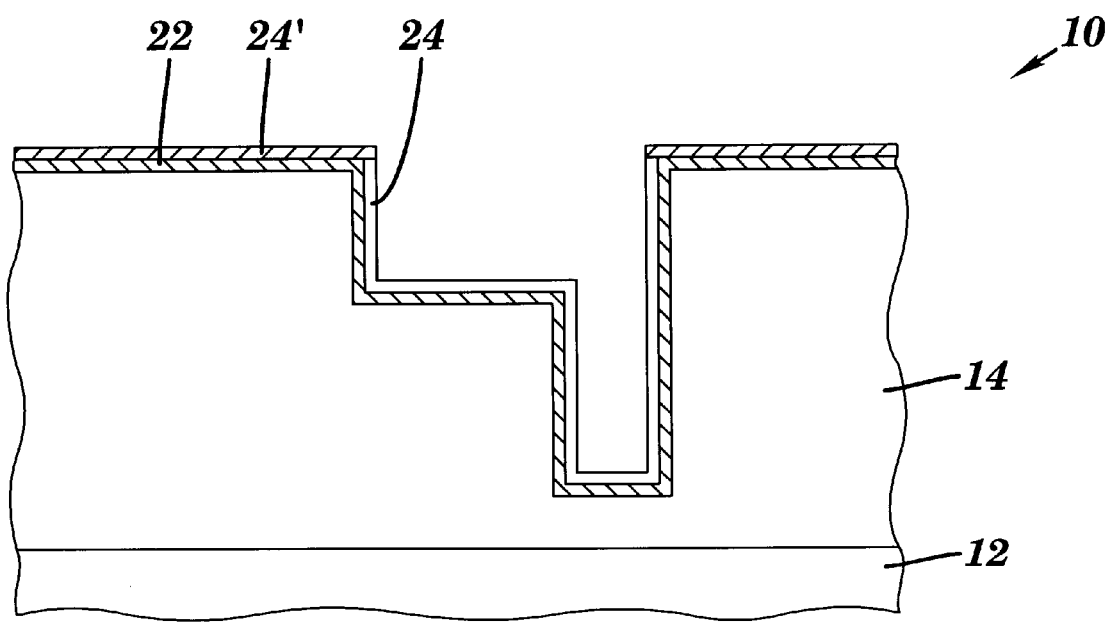
FIG. 9 depicts the structure having a poisoned top seed layer.

Following poisoning of the seed layer 24', the resist 26 is removed from the circuit feature 16, using similar techniques as described above, thereby exposing the non-poisoned or active seed layer 24 therein. The conductive material 30 is then deposited within the circuit feature 16 using the electroplating techniques described above, as shown in FIG. 8. Again, as the conductive material 30, in this example copper, grows onto the seed layer 24, which is also copper, the distinction between the seed layer 24 and the conductive material 30 disappears. The conductive material 30 does not electroplate to the poisoned seed layer 24', thereby eliminating the need for a subsequent CMP step to remove excess unwanted conductive material 30 on the top surface 28.

The top surface 28 of the structure 10 is then planarized to remove the excess conductive material 30 within the circuit feature 16 that extends above the top surface 28 of the structure 10. The planarization step also removes the poisoned seed layer 24' and the liner 22 on the top surface 28 of the structure 10, leaving the structure depicted in FIG. 6.

In accordance with a third embodiment, the top surface 28 of the structure 10 is selectively "poisoned" without the need for a sacrificial material 26. In particular, a patterned laser heater may be used to selectively poison the seed layer 24' on the top surface 28 of the structure 10 shown in FIG. 2. For example, the structure 10 may be placed in an atmosphere of $W(CO)_6$, and selectively irradiated, via exposure to a laser beam operating in the visible or infrared spectrum, for a designated period of time. As a result, the $W(CO)_6$ decomposes to form carbon monoxide and tungsten, wherein tungsten is an electroplating contaminant which effectively retards or prevents electroplating in the selectively irradiated areas.

Following poisoning of the seed layer 24', the conductive material 30 is deposited within the circuit feature 16 using electroplating techniques similar to those described above and shown in FIG. 8. The top surface 28 of the structure 10 is then planarized to remove the excess conductive material 30 that extends above the circuit feature 16 of the structure 10. The planarization step also removes the poisoned seed layer 24' and the liner 22 on the top surface 28 of the structure 10, leaving the structure depicted in FIG. 6.

It should be noted that the use of a copper conductive material 30 and seed layer 24 was intended as an example only. Copper is a good selection when electrolytic plating techniques are used. However, the present invention is also intended for use in connection with electroless plating techniques as well. Therefore, conductive materials 30 and seed layers 24 other than copper, such as aluminum, silver, tin, lead, etc., or nickel, chromium, cobalt, etc., may also be used. The seed layer 24 materials may vary depending upon the conductive material 30 selected. Moreover, the present invention may be used in conjunction with structures having various circuit features, and is in no way intended to be limited to use with dual damascene structures.

It should also be understood that the present invention contemplates applying a poison to the substrate 10 using a masking process to selectively inhibit the electroplating of the conductive material thereon.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method of forming circuit features, comprising:

providing a substrate having at least one cavity therein;

depositing a liner over a surface of the substrate;

depositing a seed layer over the liner;

rendering the seed layer ineffective to electroplating in select regions of the substrate by poisoning select regions of the seed layer using a method selected from the group consisting of: chemically converting select regions of the seed layer into an electroplating inhibitor, which comprises exposing the seed layer to a chemical bath; and heating select regions of the seed layer using a patterned laser heater; and electroplating a conductive material within the at least one cavity.

2. The method of claim 1, further including:

depositing a liner over a surface of the substrate between the substrate and the seed layer.

3. The method of claim 2, wherein the liner comprises a material reducing migration of the conductive material into the substrate.

4. The method of claim 2, wherein the liner comprises a material selected from the group consisting of: tantalum, tantalum nitride, tungsten, titanium, and titanium nitride.

5. A method of forming a semiconductor device, comprising:

providing a substrate having at least one feature therein;

depositing a seed layer over the substrate;

poisoning select regions of the seed layer using a method selected from the group consisting of: chemically converting select regions of the seed layer into an electroplating inhibitor, which comprises exposing the seed layer to a chemical bath; and heating select regions of the seed layer using a pattern laser heater; and plating a conductive material on the seed layer.

6. The method of claim 5, wherein the substrate comprises a wafer.

7. The method of claim 6, wherein the wafer comprises silicon.

8. The method of claim 5, wherein the at least one feature comprises a trench, a via, or a dual damascene circuit feature.

9. The method of claim 5, wherein the seed layer comprises a material that allows for the electroplating of the conductive material thereto.

10. The method of claim 9, wherein the seed layer comprises a material selected from the group consisting of: copper, tungsten, titanium, and tantalum.

11. The method of claim 5, wherein the select regions include a surface of the substrate surrounding and adjacent to the at least one feature.

12. The method of claim 5, wherein the conductive material is selected from the group consisting of: copper, aluminum, and silver.

* * * * *